US011466358B2

(12) United States Patent
Rajagopalan

(10) Patent No.: US 11,466,358 B2
(45) Date of Patent: Oct. 11, 2022

(54) METHOD OF FORMING A POROUS MULTILAYER MATERIAL

(71) Applicant: Jagannathan Rajagopalan, Tempe, AZ (US)

(72) Inventor: Jagannathan Rajagopalan, Tempe, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 154 days.

(21) Appl. No.: 17/120,576

(22) Filed: Dec. 14, 2020

(65) Prior Publication Data

US 2021/0371969 A1  Dec. 2, 2021

Related U.S. Application Data

(60) Provisional application No. 62/947,622, filed on Dec. 13, 2019.

(51) Int. Cl.
*C23C 14/16* (2006.01)
*C23C 14/58* (2006.01)
(Continued)

(52) U.S. Cl.
CPC .............. *C23C 14/16* (2013.01); *C23C 14/30* (2013.01); *C23C 14/34* (2013.01);
(Continued)

(58) Field of Classification Search
CPC ......... C23C 14/16; C23C 14/30; C23C 14/34; C23C 14/5873
See application file for complete search history.

(56) References Cited

U.S. PATENT DOCUMENTS

| 7,309,620 B2 * | 12/2007 | Fonash | H01L 21/2007 |
| | | | 438/960 |
| 2005/0194258 A1 * | 9/2005 | Cohen | C25D 1/003 |
| | | | 205/183 |

(Continued)

FOREIGN PATENT DOCUMENTS

KR   20000061888   * 10/2000   ........... H01L 21/768

OTHER PUBLICATIONS

Li, X. M-, et al., "A sacrificial-layer approach to prepare microfiltration membranes". Journal of Membrane Science, 320 (2008) pp. 1-7.*

(Continued)

*Primary Examiner* — Bret P Chen
(74) *Attorney, Agent, or Firm* — Fish & Richardson P.C.

(57) ABSTRACT

Forming a porous multilayer material includes forming a multilayer material on a substrate. Forming the multilayer material includes alternately forming a sacrificial layer and a semi-sacrificial layer, where the sacrificial layer includes a first metal and the semi-sacrificial layer includes the first metal and a second metal or metallic alloy. Forming the porous multilayer material further includes removing at least a portion of the first metal from each of the sacrificial and semi-sacrificial layers to yield the porous multilayer material. The porous multilayer material includes a multiplicity of metal-containing layers, each layer having a thickness in a range between about 5 nm and about 100 nm and bonded to an adjacent layer. Each layer includes chromium, niobium, tantalum, vanadium, molybdenum, tungsten, or a combination thereof. A void is defined between each pair of layers, and a density of porous the multilayer material is <1% bulk density.

16 Claims, 3 Drawing Sheets

(51) Int. Cl.
  C23C 14/30  (2006.01)
  C23C 28/02  (2006.01)
  C23C 28/00  (2006.01)
  C23C 14/34  (2006.01)
  B33Y 70/00  (2020.01)

(52) U.S. Cl.
  CPC ........ *C23C 14/5873* (2013.01); *C23C 28/021* (2013.01); *C23C 28/44* (2013.01); *B33Y 70/00* (2014.12)

(56) References Cited

U.S. PATENT DOCUMENTS

| | | | |
|---|---|---|---|
| 2011/0147944 A1* | 6/2011 | Nguyen Hoang | H01L 21/76865 257/E23.141 |
| 2011/0205615 A1* | 8/2011 | Tung | B81B 3/001 359/290 |
| 2013/0059422 A1* | 3/2013 | Lee | H01L 27/11524 257/E21.573 |
| 2013/0206600 A1* | 8/2013 | Hayashi | C23C 14/185 205/75 |
| 2014/0061757 A1* | 3/2014 | Kim | H01L 29/788 438/259 |
| 2014/0363950 A1* | 12/2014 | Vrtis | H01L 21/764 438/421 |
| 2016/0194774 A1* | 7/2016 | Cohen | C23C 28/023 205/67 |
| 2018/0259268 A1* | 9/2018 | Zhou | F28D 15/046 |
| 2018/0269229 A1* | 9/2018 | Or-Bach | H01L 29/7889 |
| 2019/0148286 A1* | 5/2019 | Or-Bach | H01L 27/11529 257/315 |
| 2020/0168464 A1* | 5/2020 | Loh | H01L 21/67086 |

OTHER PUBLICATIONS

Ilyas, Shazia, et al., "Multifunctional polyelectrolyte multilayers as nanofiltration membranes and as sacrificial layers for easy membrane cleaning". Journal of Colloid and Interface Science 446 (2015) 386-393.*

Prevot, Vanessa, et al., "3D hierarchical and porous layered double hydroxide structures: an overview of synthesis methods and applications". J Mater Sci (2017) 52:11229-11250.*

Xiong, Juan, et al., "Layered NiCo alloy nanoparticles/nanoporous carbon composites derived from bimetallic MOFs with enhanced electromagnetic wave absorption performance". Carbon 154 (2019) 391-401.*

Chiang, C.-C., et al. "Annihilating Pores in the Desired Layer of a Porous Silicon Bilayer with Different Porosities for Layer Transfer". Scientific Reports (2019) 9:12631, pp. 1-9.*

Bell, T E., et al., "Porous silicon as a sacrificial material". J. Micromech. Microeng. 6 (1996) 361-369.*

Piazza, Alisha, et al., "Electroplated, Porous, 3D Metallic Structures using Sacrificial Two-Photon Lithography Templates". ENGR241 Research Report, Fall Quarter 2019, pp. 1-14.*

So, Monica C., et al., "Layer-by-Layer Fabrication of Oriented Porous Thin Films Based on Porphyrin-Containing Metal-Organic Frameworks". J. Am. Chem. Soc. 2013, 135, 15698-15701.*

Weisse, Jeffrey M., et al., "Electroassisted Transfer of Vertical Silicon Wire Arrays Using a Sacrificial Porous Silicon Layer". Nano Letters 2013, 13, 4362-4368.*

* cited by examiner

METHOD OF FORMING A POROUS MULTILAYER MATERIAL

CROSS-REFERENCE TO RELATED APPLICATION

This application claims the benefit of U.S. Application No. 62/947,622 entitled "ULTRA-LOW DENSITY METALLIC COATINGS" and filed on Dec. 13, 2019, which is incorporated by reference herein in its entirety.

TECHNICAL FIELD

This invention relates to ultra-low density (<1% bulk density) metallic protective coatings with high specific strength and deformability, good creep and oxidation resistance, and low thermal conductivity for use in extreme environments. The coating may be composed of elemental metals or metallic alloys, including high entropy alloys.

BACKGROUND

Thermal barrier coatings (TBCs) are used to protect structural alloys in extreme (temperature/stress/radiation) environments (e.g., space reentry/hypersonic vehicles, aero turbines). Porous ceramics are often used as the topcoat of TBCs because of their high strength and melting point, and low thermal conductivity. But ceramic topcoats are brittle and can undergo catastrophic cracking or spallation, leading to sudden component failure.

SUMMARY

This disclosure relates to ultra-low density (<1% bulk density) metallic protective coatings with high specific strength and deformability, good creep and oxidation resistance, and low thermal conductivity for use in extreme environments such as space reentry or hypersonic vehicles, aircraft and power plant turbines, and automotive engines. The strong, resilient, and low thermal conductivity coatings allow substantially higher operating temperatures in aero engines and hypersonic/reentry vehicles, leading to increased performance, lifetime, and reusability.

Synthesis of these coatings includes deposition of a thick sacrificial metal (SM) layer followed by a thin layer composed of the SM and the protective metal (PM). Multiple SM and SM+PM layers are deposited alternatively to form a 100-500 µm thick multilayer. The multilayer may be directly coated on the desired component or harvested for subsequent spray coating or 3D printing. The SM in the multilayer is selectively dissolved to create highly porous, unevenly stacked, corrugated PM layers. The PM layers are diffusion bonded by sintering to form the PM coating. The PM coating may be partially or fully oxidized to form an oxide protective coating, if needed.

In a first general aspect, forming a porous multilayer material includes forming a multilayer material on a substrate. Forming the multilayer material includes alternately forming a sacrificial layer and a semi-sacrificial layer, where the sacrificial layer includes a first metal and the semi-sacrificial layer includes the first metal and a second metal or metallic alloy. Forming the porous multilayer material further includes removing at least a portion of the first metal from each of the sacrificial and semi-sacrificial layers to yield the porous multilayer material.

Implementations of the first general aspect may include one or more of the following features.

The porous multilayer material may be sintered to bond each semi-sacrificial layer to an adjacent semi-sacrificial layer. In some cases, the multilayer material is separated from the substrate before removing at least the portion of the first metal. After removing at least the portion of the first metal, the porous multilayer material can be sintered to bond each semi-sacrificial layer to an adjacent semi-sacrificial layer. In certain cases, the porous multilayer material is crushed and used as a particulate.

In some implementations, forming the sacrificial layer includes electron beam evaporation of the first metal. In certain implementations, forming the semi-sacrificial layer includes sputtering. Removing at least the portion of the first metal can include dissolving at least the portion of the first metal or boiling off at least the portion of the first metal. In some cases, removing at least the portion of the first metal includes removing substantially all of the first metal. Removing at least the portion of the first metal defines voids between the semi-sacrificial layers.

A thickness of each sacrificial layer is typically in a range of about 0.2 µm to about 2 µm. A thickness of each semi-sacrificial layer is typically in range of about 5 nm to about 100 nm. A thickness of the porous multilayer material is typically in a range of about 100 µm to about 500 µm.

The first metal can include copper, magnesium, or both. The second metal or metallic alloy can be chromium, niobium, tantalum, vanadium, molybdenum, tungsten, or a combination thereof. In some cases, each semi-sacrificial layer includes about 70 to about 85 atomic percent of the first metal.

In a second general aspect, a multilayer material includes a multiplicity of metal-containing layers, each layer having a thickness in a range between about 5 nm and about 100 nm and bonded to an adjacent layer. Each layer includes chromium, niobium, tantalum, vanadium, molybdenum, tungsten, or a combination thereof. A void is defined between each pair of layers, and a density of the multilayer material is <1% bulk density.

In a third general aspect, an article includes the multilayer material of the second general aspect.

In a fourth general aspect, a three-dimensional (3D) printing feedstock includes the multilayer material of the second general aspect.

Advantages of the methods and coatings described in this disclosure include a combination of high temperature specific strength (>50 MPa·cc/gm at 1500° C.), deformability (>10% macroscopic failure strain) and low thermal conductivity (<0.1 W/mK). The PM coatings can either be made from an elemental metal such as chromium or a metallic alloy (with or without compositional changes across the thickness). The mechanical, thermal, and functional properties of the PM coatings can be explicitly varied across their thickness to mitigate thermal stresses, improve adhesion with base material, and increase oxidation, creep, and wear resistance. The strong, resilient, and low thermal conductivity PM coatings allow substantially higher operating temperatures in aero engines and hypersonic/reentry vehicles, leading to increased performance, lifetime, and reusability.

The details of one or more embodiments of the subject matter of this disclosure are set forth in the accompanying drawings and the description. Other features, aspects, and advantages of the subject matter will become apparent from the description, the drawings, and the claims.

DETAILED DESCRIPTION

This disclosure describes the synthesis of ultra-low density (<1% bulk density) protective metal (PM) coatings with high temperature specific strength (>50 MPa·cc/gm at ~1500 C), deformability (>10% macroscopic failure strain), good creep and oxidation resistance, and low thermal conductivity (<0.1 W/mK) for use in extreme environments such as space reentry/hypersonic vehicles, aircraft and power plant turbines, and automobile engines. The synthesis method includes physical vapor deposition techniques such as sputtering and evaporation, and does not require any unusual equipment or manufacturing techniques. Methods include direct deposition of the PM coatings on structural components and production of PM meshes for spray coating and three-dimensional (3D) printing feedstock. The coatings may include elemental metals or metallic alloys, including high entropy alloys.

Figure 1A:
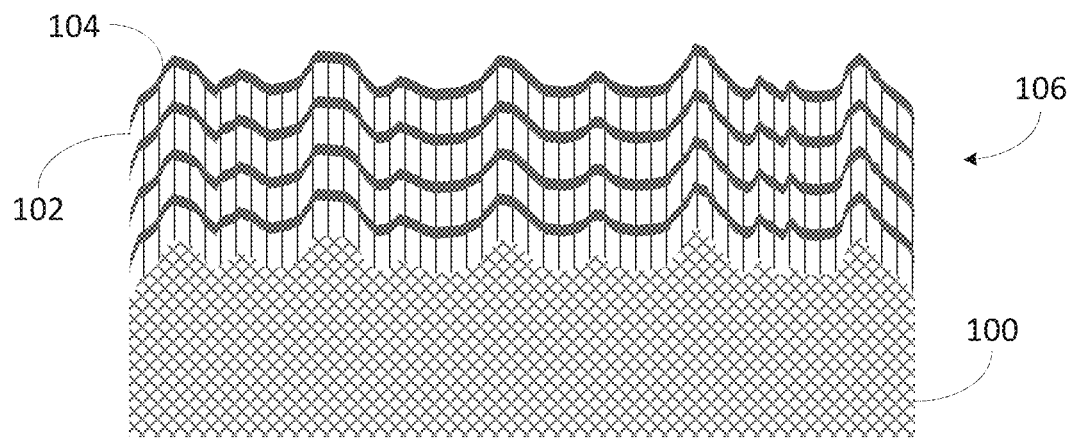
FIGS. 1A-1C depict steps in an exemplary method for synthesizing an ultra-low density, protective metal (PM) coating.
Figure 1B:
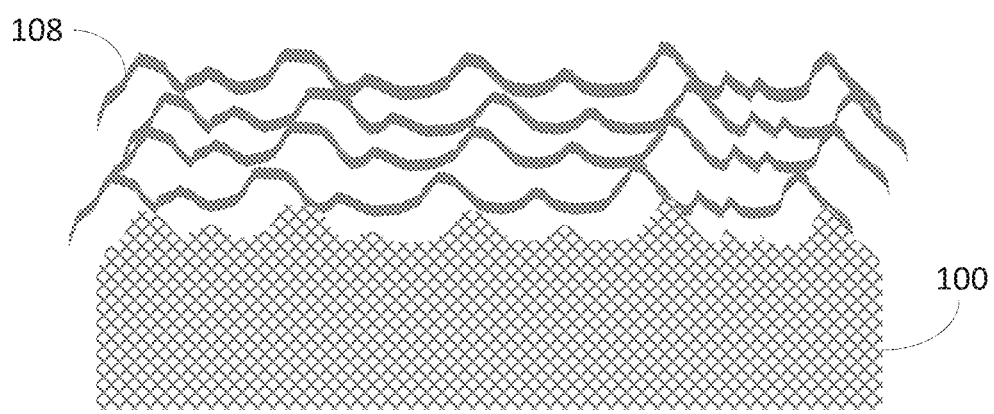
Figure 1C:
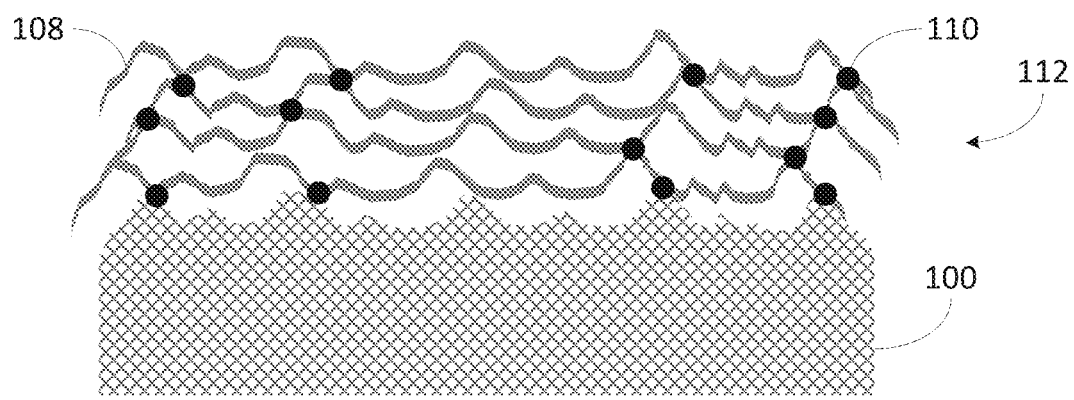
Figure 2:
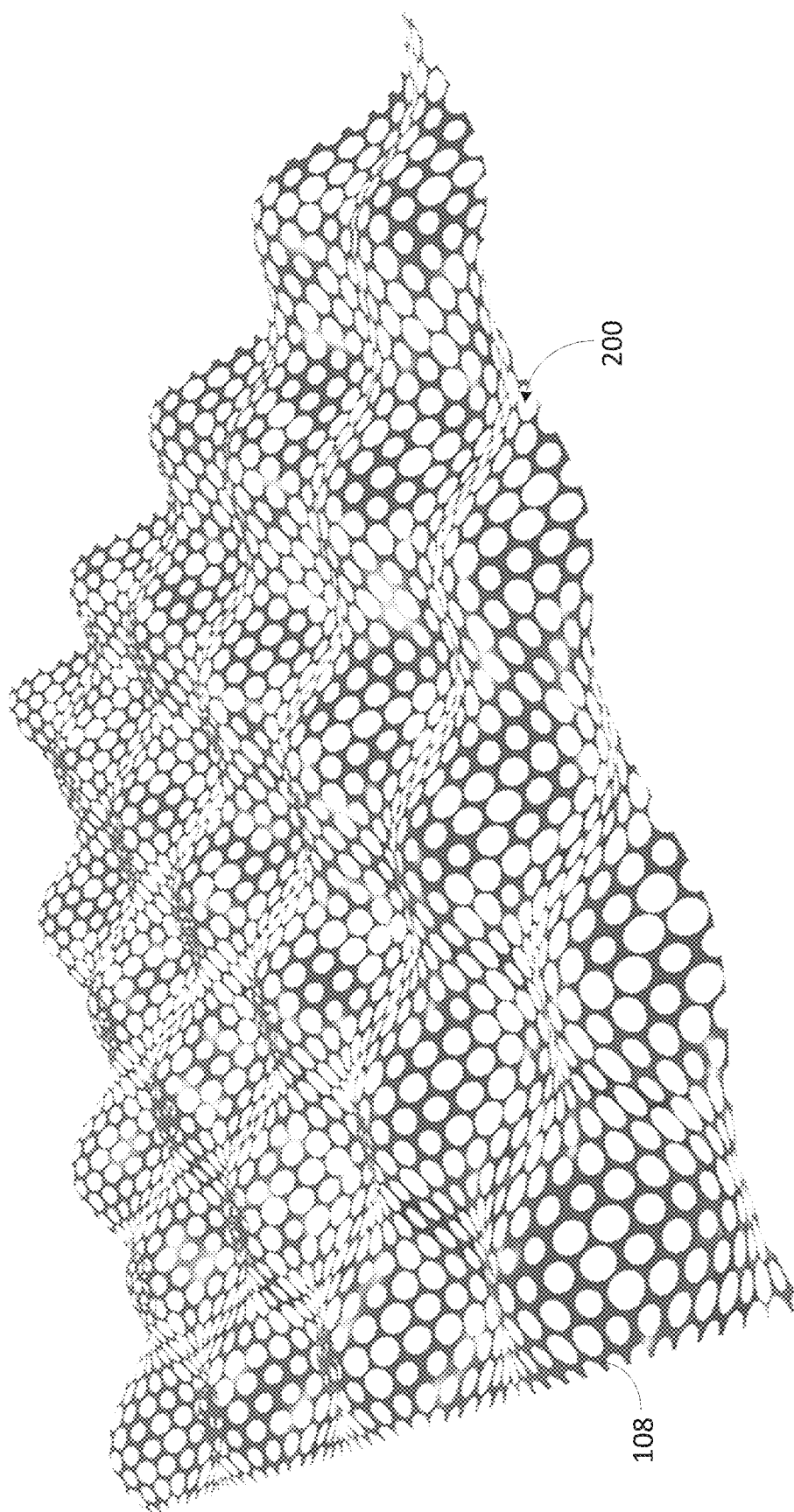
FIG. 2 depicts a three-dimensional view of a corrugated PM layer with idealized circular openings.

As depicted in FIG. 1A, direct deposition of PM coatings on substrate 100 includes repeated deposition of sacrificial layer 102 followed by semi-sacrificial layer 104 to form multilayer 106. Sacrificial layer 102 includes a sacrificial metal (SM), and typically has a thickness in a range between about 0.2 µm and about 2 Semi-sacrificial layer 104 includes a SM and a PM (e.g., about 70 to about 85 atomic percent SM), and typically has a thickness in a range of about 5 nm to about 100 nm. Multilayer 106, which includes a multiplicity of sacrificial layers 102 and semi-sacrificial layer 104, typically has a thickness in a range of about 100 µm to about 500 µm thick. The SM is selectively dissolved (with slight agitation, if needed) in sacrificial layer 102 and semi-sacrificial layer 104 to create porous layers 108, depicted in FIG. 1B. In one example, porous layers 108 are unevenly stacked, corrugated refractory high entropy alloy (RHEA) layers. As depicted in FIG. 1C, porous layers 108 are bonded (e.g., diffusion bonded) at sites 110 (e.g., to prevent layer sliding) by sintering at temperatures ranging from 800° C. to 2400° C. for up to 24 hours to yield PM layer (or coating) 112. PM layer 112 can accommodate large deformations via bending or buckling. FIG. 2 depicts a three-dimensional view of a corrugated, porous layer 108 with idealized circular openings 200.

In some examples, the SM includes Mg, Cu, or both. The PM includes Cr, Nb, Ta, V, Mo, or W, or alloys including one or two or more of these elements (including high entropy alloys). Cr, Nb, Ta, V, Mo, and W are all considered to be immiscible with Cu and Mg. Cu and Mg can be selectively dissolved by deionized water or dilute acids (e.g., nitric acid). Mg can also be boiled away due at least in part to its low boiling point (1091° C.). Sputtering can be used for the semi-sacrificial (SM+PM) layer 104 as it enables precise compositional control. Electron beam evaporation can be used for sacrificial (SM) layer 102 since it can provide higher deposition rates (e.g., up to 1 µm/min).

Instead of or in addition to directly depositing the PM coating 112 on a substrate (e.g., a structural component), PM meshes can also be prepared for spray coating or as feedstock for three-dimensional (3D) printing. A low adhesion substrate can be used so that the multilayers can be peeled off and harvested. The SM can then be dissolved from the harvested multilayers, leaving a PM mesh that can be crushed, spray coated, and sintered on the desired component. Alternately, the multilayers can be compacted and extruded to create feedstock for 3D printing (e.g., fused deposition modeling). After printing, the PM coating can be formed by SM dissolution and sintering.

The PM coatings synthesized as described in this disclosure demonstrate a combination of high temperature specific strength (>50 MPa·cc/gm at 1500 C), deformability (>10% macroscopic failure strain) and low thermal conductivity (<0.1 W/mK). In addition, the chemical composition and microstructure of the PM layers can be tailored across the thickness to mitigate or eliminate stresses that arise from thermal mismatch with the substrate (e.g., a structural alloy) as well as improve adhesion with the substrate.

Example

Figure 3A:
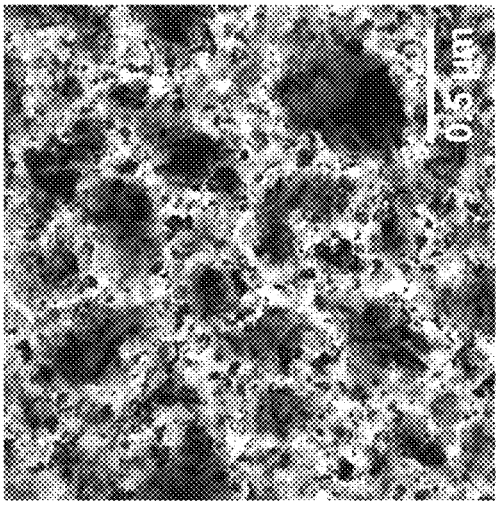
FIGS. 3A and 3B show bright field transmission electron microscopy (TEM) images of a CuNb (80 atomic % Cu) film that was co-deposited at 750° C.
Figure 3B:
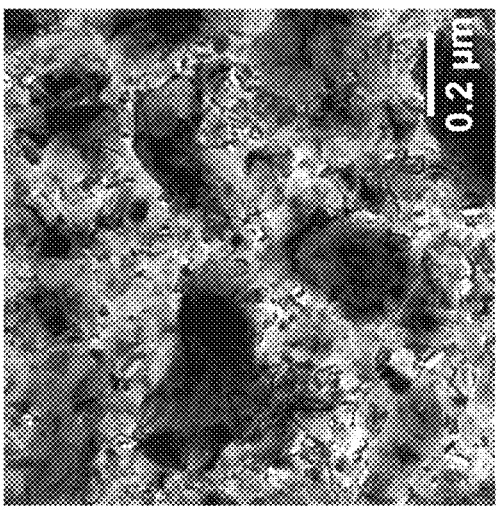
Figure 3C:
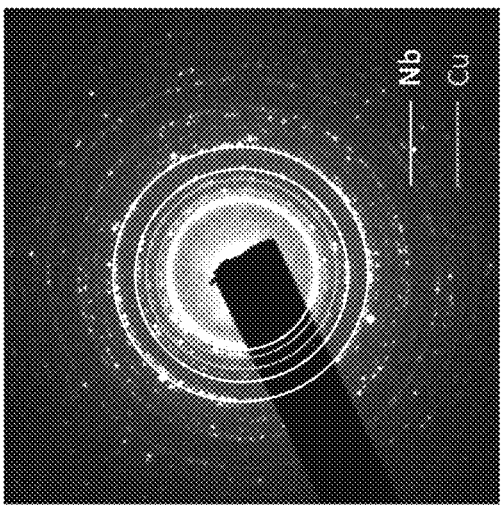
FIG. 3C shows selected area diffraction (SAD) pattern of a CuNb film showing both Cu and Nb diffraction rings. Only the first few rings are indicated.
Figure 3D:
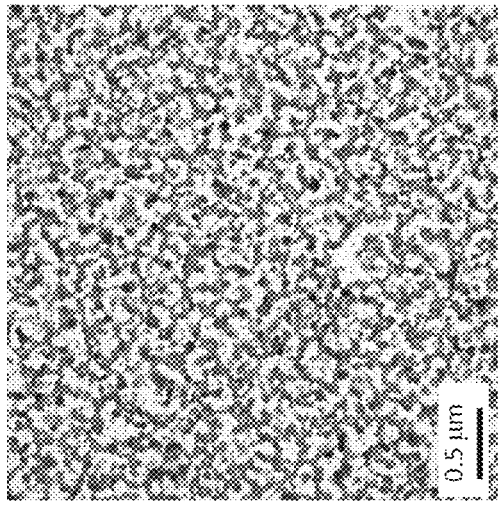
FIGS. 3D and 3E show bright field TEM images of a CuNb film after selectively dissolving Cu, revealing a highly porous structure.
Figure 3E:
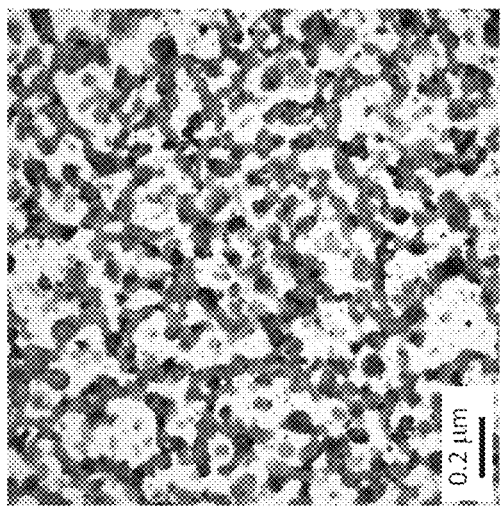
Figure 3F:
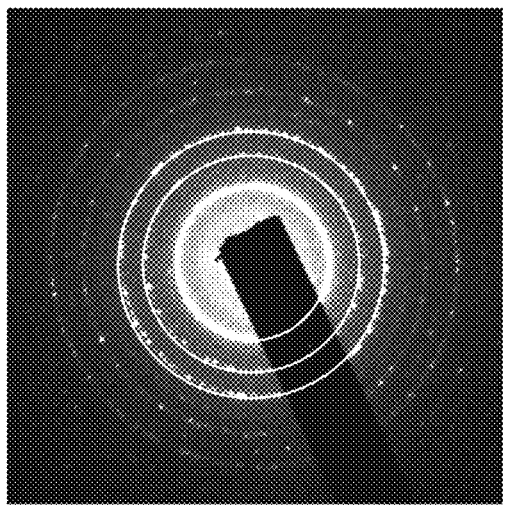
FIG. 3F is a SAD pattern of a porous film showing only Nb diffraction rings.

FIGS. 3A and 3B show bright field transmission electron microscopy (TEM) images of an example SM+PM layer (CuNb film composed of 80 atomic % Cu) that was co-deposited at 750° C. FIG. 3C shows selected area diffraction (SAD) pattern of a CuNb film showing both Cu and Nb diffraction rings. Only the first few rings are indicated. FIGS. 3D and 3E show bright field TEM images of a CuNb film after selectively dissolving Cu, revealing a highly porous structure with pores having a dimension in a range between 5 nm and 200 nm. FIG. 3F is a SAD pattern of a porous film showing only Nb diffraction rings.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A method of forming a porous multilayer material, the method comprising:
   forming a multilayer material on a substrate, wherein forming the multilayer material comprises alternately forming a sacrificial layer and a semi-sacrificial layer, wherein the sacrificial layer comprises a first metal and the semi-sacrificial layer comprises the first metal and a second metal or metallic alloy;
   separating the multilayer material from the substrate; and
   removing at least a portion of the first metal from each of the sacrificial and semi-sacrificial layers to yield the porous multilayer material.

2. The method of claim 1, further comprising sintering the porous multilayer material to bond each semi-sacrificial layer to an adjacent semi-sacrificial layer.

3. The method of claim 1, further comprising, after removing at least the portion of the first metal, sintering the porous multilayer material to bond each semi-sacrificial layer to an adjacent semi-sacrificial layer.

4. The method of claim 3, further comprising crushing the porous multilayer material.

5. The method of claim 1, wherein forming the sacrificial layer comprises electron beam evaporation of the first metal.

6. The method of claim 1, wherein forming the semi-sacrificial layer comprises sputtering.

7. The method of claim 1, wherein removing at least the portion of the first metal comprises dissolving at least the portion of the first metal.

8. The method of claim 1, wherein removing at least the portion of the first metal comprises boiling off at least the portion of the first metal.

9. The method of claim 1, wherein removing at least the portion of the first metal comprises removing substantially all of the first metal.

10. The method of claim 1, wherein removing at least the portion of the first metal defines voids between the semi-sacrificial layers.

11. The method of claim 1, wherein a thickness of each sacrificial layer is in a range of about 0.2 μm to about 2 μm.

12. The method of claim 1, wherein a thickness of each semi-sacrificial layer is in range of about 5 nm to about 100 nm.

13. The method of claim 1, wherein a thickness of the porous multilayer material is in a range of about 100 μm to about 500 μm.

14. The method of claim 1, wherein the first metal comprises one or both of copper and magnesium.

15. The method of claim 1, wherein the second metal or metallic alloy comprises one or more of chromium, niobium, tantalum, vanadium, molybdenum, and tungsten.

16. The method of claim 1, wherein each semi-sacrificial layer comprises 70-85 atomic percent of the first metal.

* * * * *